United States Patent [19]
Kurosaki

[11] Patent Number: 5,747,816
[45] Date of Patent: May 5, 1998

[54] CHARGED PARTICLE BEAM APPARATUS

[75] Inventor: Toshiei Kurosaki, Hitachinaka, Japan

[73] Assignee: Hitachi, Ltd., Tokyo, Japan

[21] Appl. No.: 670,047

[22] Filed: Jun. 25, 1996

[30] Foreign Application Priority Data

Jul. 5, 1995 [JP] Japan .................... 7-169759

[51] Int. Cl.⁶ .............. H01J 37/22; H01J 37/28
[52] U.S. Cl. ........................... 250/491.1
[58] Field of Search ...................... 250/491.1

[56] References Cited

U.S. PATENT DOCUMENTS

| | | | |
|---|---|---|---|
| 4,447,731 | 5/1984 | Kuni et al. | 250/442.1 |
| 4,785,187 | 11/1988 | Kariya et al. | 250/491.1 |
| 5,117,110 | 5/1992 | Yasutake | 250/306 |
| 5,608,226 | 3/1997 | Yamada et al. | 250/491.1 |

FOREIGN PATENT DOCUMENTS

| | | |
|---|---|---|
| A-2105858 | 3/1983 | United Kingdom. |
| 2263335 | 7/1993 | United Kingdom ............. 250/491.1 |

OTHER PUBLICATIONS

Patent Abstracts Of Japan, vol. 013, No. 269, (P–888), Jun. 21, 1989 & JP–A–01 061718 (Nikon Corp), Mar. 8, 1989.

*Primary Examiner*—Jack I. Berman
*Attorney, Agent, or Firm*—Kenyon & Kenyon

[57] ABSTRACT

In a scanning electron microscope, a couple of fiducial patterns which are so laid out on the X-Y stage as to be separated with a distance equivalent to the distance between the optical axis of the optical microscope and the optical axis of the electronic optical system, the image signals of these patterns are captured by the image processing circuit, the position shift of the optical axis of the optical microscope and the position shift of the optical axis of the electronic optical system with respect to the fiducial patterns are obtained by numerical calculation, and then, this position shift is used as an offset value in the actual measurement by the scanning electron microscope, which leads to an accurate positioning.

18 Claims, 3 Drawing Sheets

CHARGED PARTICLE BEAM APPARATUS

BACKGROUND OF THE INVENTION

The present invention relates to a charged particle beam apparatus, especially to a charged particle beam apparatus good for a semi-conductor production equipment for producing semi-conductors, and for a measurement and evaluation apparatus used in the measurement and evaluation process for the semi-conductor production.

In recent years, what is used in producing semi-conductor devices and their characteristics measurement and evaluation process is an apparatus using electron beams or ion beams as charged particles. For example, there is a scanning electron microscope in which an image is formed by detecting secondary electrons which are generated when the electron beams are irradiated onto a specimen. The secondary electrons are measured by synchronizing the scanning operation of the irradiation electron beams, producing a fine pattern. Furthermore, the dimension of a designated pattern in the formed image is measured. There is also an electron beam exposure apparatus for forming a fine pattern on the wafer by processing the photoresist with electron beams. There is also an ion beam apparatus for observing and processing the semi-conductor devices with ion beams.

These systems are composed of a charged particle beam optical system including an generation source of the charged particle beams such as electron beam or ion beam, and a means for directing the charged particle beam to the specimen; an X-Y stage for fixing the specimen to a designated position and a control system for controlling those.

In the scanning electron microscope having a function for measuring the dimension of fine patterns, an optical microscope is installed in addition to the electronic optical system, and the patterns formed on the wafer can be observed and measured with low magnification, as disclosed, for example, in Japanese Patent Publication No. 3-52178. The following effects can be obtained by using this function.

When fine patterns are observed and measured with high magnification in the electronic optical system, the magnification is so high for the direct observation in the electronic optical system, that it is not possible to fix the pattern in a designated position. In order to solve this problem, at first, a designated pattern and its neighboring pattern are observed and their positions are fixed by using an optical microscope. Next, the designated pattern with its position being fixed by the optical microscope is fixed at a observation position for the electronic optical system so that the fine pattern may be observed and measured with high magnification by the electronic optical system.

In the scanning electron microscope, it is necessary to obtain precisely the position of the wafer on the X-Y stage in order to measure the pattern at a pre-determined position on the wafer. In order to solve this problem, before the measurement of the pattern on the wafer, the position of the wafer is measured by using a specific alignment pattern on the wafer, and the wafer alignment is adjusted. This measurement can be performed by the optical microscope.

It is required to keep precisely the distance between the optical axis of the optical microscope and the optical axis of the electronic optical system. The distance between these optical axis is about 50 mm, and is calibrated on the basis of the positioning detector of the stage when assembling and adjusting the apparatus. However, there is an upper-bound for the accuracy in the positioning of the stage, and error from ±2 µm to ±5 µm can not be avoided. For this reason, it is practically difficult to calibrate precisely the distance between a couple of optical axes. In addition, many trial-and-error operations are required for the calibration to work requiring a lot of time.

The distance between the optical axis of the optical microscope and the optical axis of the electric optical system may be deviated when operating the apparatus. In case that the distance between these optical axes changes by ±5 µm, when the designated pattern is observed and measured by the electronic optical system with high magnification after the designated pattern is observed and measured by the optical microscope and the position of the wafer is fixed, there is such a disadvantage that the pattern positioned with the X-Y stage can not be fixed within the observation scope of the electronic optical system.

Since it is required to calibrate again the distance between the optical axes when that the distance between the optical axes is deviated, and since the calibration operation is performed by try-and-error similar to that in the assembling and adjusting the apparatus using the pattern formed on the wafer which is used normally for measurement, a lot of time is taken for the adjusting operation.

SUMMARY OF THE INVENTION

The present invention is to provide a charged particle beam apparatus adequate for enabling to calibrate precisely the distance between the optical axis of the optical microscope and the optical axis of the particle beam optical system.

The present invention is to provide a charged particle beam apparatus adequate for enabling to calibrate precisely the distance between the optical axes of the first and the second charged particle beam optical systems.

The present invention can be attained by providing a charged particle beam apparatus having a charged particle beam optical system including a means for generating a charged particle beam, a means for deflecting the charged particle beam, and an optical system for irradiating light onto a specimen, wherein at least a first and a second fiducial patterns are provided on the specimen or a stage mounting the specimen, and the first and the second fiducial patterns is detected separately by the charged particle beam optical system and the optical system, respectively.

According to this configuration, as the calibration of the distance between the optical axis of the optical system irradiating light onto the specimen (such as an optical microscope) and the optical axis of the charged particle beam optical system is enabled by means that the first and the second fiducial patterns are independently observed and their positions are measured by the optical microscope and the charged particle beam optical system, respectively, the calibration operation can be done precisely.

According to another aspect of the present invention, in a charged particle beam apparatus having a charged particle beam optical system including a charged particle source for generating a charged particle beam and a means for directing the charged particle beam to the specimen mounted on the stage, and having an optical microscope for observing the specimen, what is provided is a charged particle beam apparatus so configured that the first and the second fiducial patterns are formed on the stage, the first and the second fiducial patterns are observed independently by using the first and the second charged particle beam optical systems, respectively, and that the position of the patterns is measured.

According to this configuration, as the calibration of the distance between the optical axes of the first and the second charged particle beam optical systems is enabled by means that the first and the second fiducial patterns are independently observed and their positions are measured individually by the first and the second charged particle beam optical systems, respectively, the calibration operation can be done precisely.

Features will be clarified by the following description of Detailed Description of the Preferred Embodiments referring to the accompanied figures.

DETAILED DESCRIPTION

Figure 1:
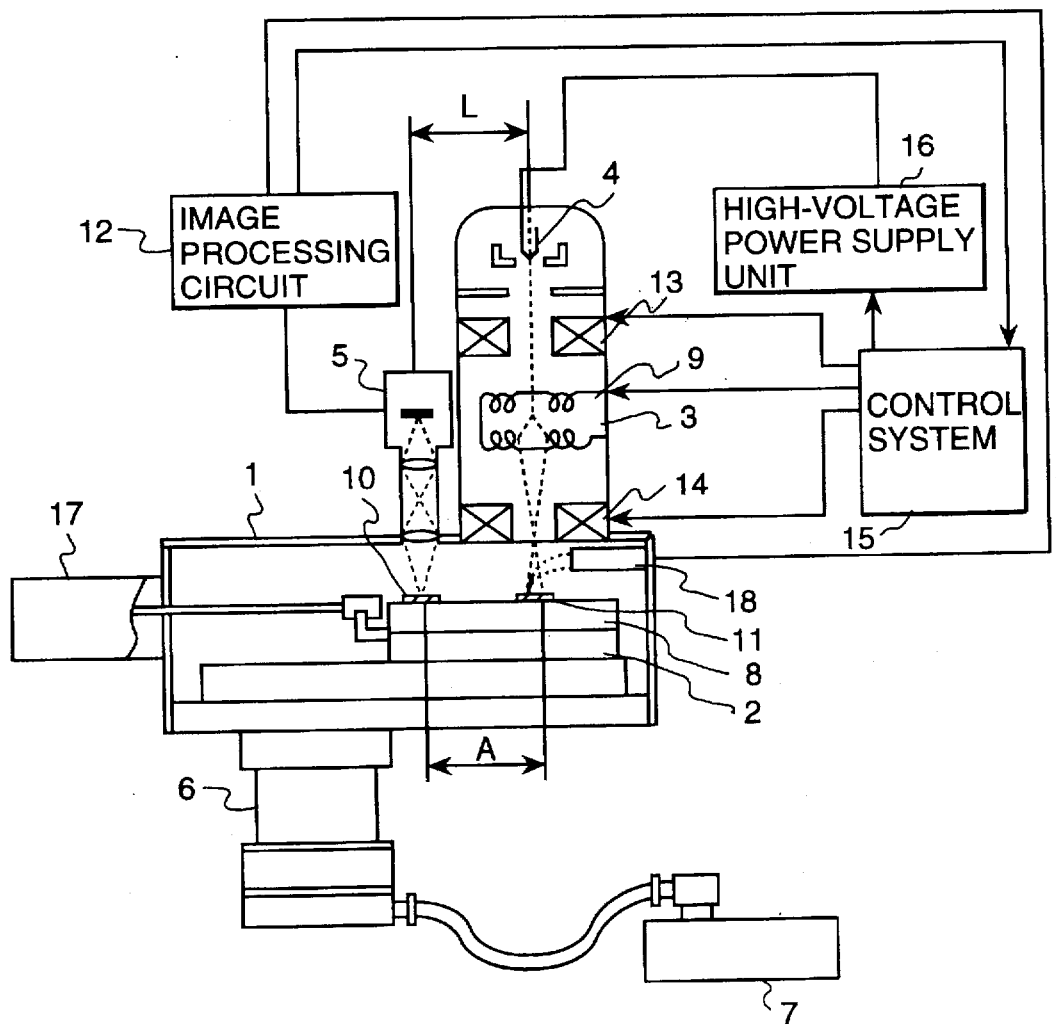
FIG. 1 is a view showing the construction of a scanning electron microscope having an optical microscope as an embodiment of a charged particle beam apparatus in accordance with the present invention.

FIG. 1 shows the structure of a scanning electron microscope having an optical microscope in one embodiment of the charged particle beam apparatus of the present invention. In a specimen chamber 1, a wafer (not shown in FIG. 1) to be supplied as a specimen is mounted on a specimen holder 6, and the specimen holder is mounted on the X-Y stage 2 used for moving the wafer mounted on the specimen holder in X and Y directions. An electronic optical system is incorporated in an optical column assembly 3 above the specimen chamber 1, which includes electron lenses 13 and 14 for converging a generated electron beam onto the wafer and a bias coil 9 and so on. The lenses 13 and 14 and the bias coil 9 are controlled by a control system 15. An electron gun 4 is connected to a high-voltage power supply unit 16 which is also controlled by the control system 15. A secondary electron detector 18 for detecting a secondary electron generated from the wafer or a fiducial pattern to be explained later by electron beam exposure is mounted in the specimen chamber 1, and an optical microscope 5 is also mounted at the side part of the column 3.

Fiducial patterns 10 and 11 are placed on the specimen holder 8 mounted on the stage 2. Both fiducial patterns are placed in a position other than the place in which the wafer as a specimen is mounted, that is, the position around the specimen holder 8. The fiducial pattern 11 is one specifically used for the electronic optical system, and the fiducial pattern 10 is one specifically used for the optical microscope 5. The distance between the fiducial pattern 10 and the fiducial pattern 11 is so defined as to be equal to the distance between the optical axis of the electronic optical system and the optical axis of the optical microscope 5. For example, the distance is set to be 50 mm.

When the fiducial pattern 10 is positioned at the center of the optical axis of the optical microscope 5, the fiducial pattern 11 is positioned at the center of the optical axis of the electronic optical system. In this time, the image signal of the fiducial pattern 10 obtained by the optical microscope 5 is supplied to the image processing circuit 12. In addition, The image signal of the fiducial pattern 11 defined by the secondary electrons detected by the secondary electron detector 18 when the electron beam is biased in X and Y directions by using the bias coil 9 is supplied to the image signal processing circuit 12. The image processing signal from the image processing circuit 12 is supplied to the control circuit 15, where the images of the fiducial patterns 10 and 11 are displayed on its display part.

The inside gas of the specimen chamber 1 is evacuated so that a designated vacuum level may be established in the specimen chamber 1. This evacuation operation is performed by the turbo molecular pump 6 and the rotary pump 7 used for coarse evacuation.

Next, what is described is the method for calibrating the distance between the optical axes of the electronic optical system and the optical microscope by using the fiducial patterns 10 and 11. Before starting the observation and size measurement of the pattern by using the scanning electron microscope, the relative position between the electronic optical system and the optical microscope is calibrated.

At first, the fiducial patterns 10 and 11 are positioned by moving the X-Y stage so as to be located in their corresponding visible scopes for the optical microscope and the electronic optical system, respectively. Next, the images of the fiducial patterns captured by the electronic optical system and the optical microscope are supplied to the image processing circuit 12, where the relative position shift A1 and A2 between the individual fiducial pattern and its corresponding optical axis are obtained by numerical calculation. The distance between a couple of fiducial patterns is defined as A which is made beforehand to be equal to the distance L between the optical axis of the electronic optical system and the optical axis of the optical microscope. For example, if the design value of L is 50 mm, A becomes 50 mm. Therefore, the positional relations A1 and A2 contain the errors in positioning the X-Y stage and the deviation of the distance L between the optical axis of the electronic optical system and the optical axis of the optical microscope. In principle, if L is exactly equal to A, then A1 must be equal to A2. However, in case that L changes, L is not equal to A and hence, A1 is not equal to A2, and thus, the deviation component is given as A1–A2. This relation can be expressed in the following formula.

$$L = A + (A1 - A2)$$

From the above formula, the deviation value accompanied with the detection of the fiducial patterns is proved to be (A1–A2). In the measurement with the scanning electron microscope, the positional relationship between the optical microscope and the electronic optical system can be precisely evaluated by using the deviation value (A1–A2) of the distance L between both optical systems as an offset value. At first, the fine pattern to be observed and measured by the electronic optical system is positioned by using the optical microscope, and next, the pattern can be positioned on the optical axis of the electronic optical system by using the X-Y stage with consideration of the offset value obtained at first. In case that the offset value is defined on the basis of the optical axis of the electronic optical system, the offset is added to the position of the optical axis of the optical microscope. On the other hand, in case that the offset value is defined on the basis of the optical axis of the optical microscope, the optical axis of the electronic optical system is biased by adding the offset value onto the current flowing in the bias coil, which establishes the offset of the center of the optical axis of the electronic optical system.

When positional relationships between the fiducial pattern and each of the centers of the optical axes are expressed as $(A1_x, A1_y),(A2_x, A2_y)$, the deviation value can be obtained as follows. The distance $A_X$, $A_Y$ between the two fiducial patterns is preset to the distance $L_X$, $L_Y$ between the optical axis of the electronic optical system and the optical axis of the optical microscope. Therefore, the positional relationships $(A1_X, A1_Y),(A2_X, A2_Y)$ include the positioning error of the X-Y stage and the deviation value of the distance $L_X$, $L_Y$ between the optical axis of the electronic optical system and the optical axis of the optical microscope. However, since the positioning error of the X-Y stage is commonly included in the both fiducial patterns, the positional relationships $(A1_X, A1_Y),(A2_X, A2_Y)$ directly become the deviation value of the distance $L_X$, $L_Y$ between the optical axis of the electronic optical system and the optical axis of the optical microscope.

Therefore, the deviation value of the distance $L_X$, $L_Y$ between the optical axes can be expressed as the following equations.

$$L_X = A_X + (A1_X - A2_X)$$

$$L_Y = A_Y + (A1_Y - A2_Y)$$

Accordingly, the deviation values can be known as follows by detecting the fiducial pattern.

$$\Delta X = (A1_X - A2_X)$$

$$\Delta Y = (A1_Y - A2_Y)$$

Then, when measurement is performed in the scanning electron microscope, the positional relationship between the optical microscope and the electronic optical system can be accurately obtained by offsetting the deviation values $\Delta X$, $\Delta Y$ in the distance $L_X$, $L_Y$ between the optical axes.

In the above described configuration and method, in the electronic optical system, it is possible to establish a high accuracy in the positioning operation for a designated fine pattern without any positioning error even in high magnification.

Figure 2:
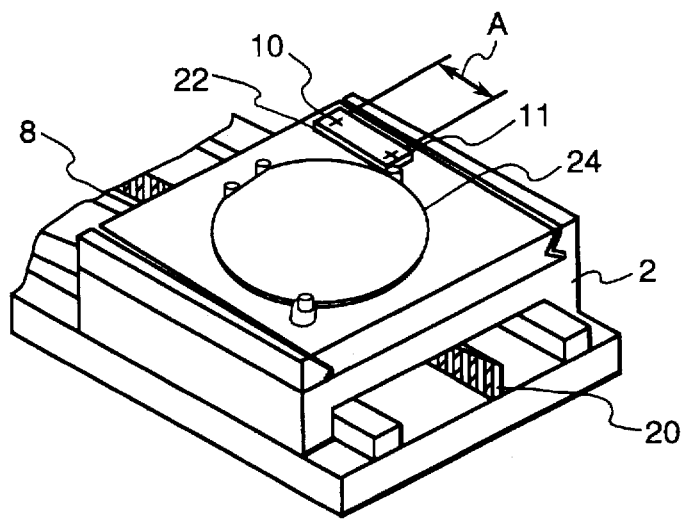
FIG. 2 is a perspective view showing another embodiment of a specimen stage portion.

On the other hand, as shown in FIG. 2, by forming a couple of fiducial patterns 10 and 11 on a single member 22 mounted on the specimen holder 8 on the stage 2, it is enabled to establish more precisely the distance between the fiducial patterns 10 and 11. The component 24 is a wafer, and the component 20 is a position detector for detecting the position of the X-Y stage 2.

Figure 3:
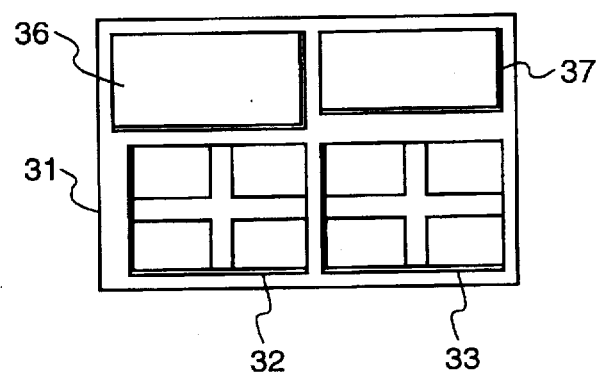
FIG. 3 is a front view showing the concept of a control system.

When observing the fiducial patterns by the electronic optical system and the optical microscope, in case that the number of monitors installed in the display part is only one, it is possible to observe them by altering the display objects on the single monitor, but this method requires complicated operations for the operator. In order to solve this problem, different arts in the display panel 31 in the display part of the control system as shown in FIG. 3, that is, both of the display panels 32 and 33, are displayed at the same time. Though a single display panel is displayed in a normal mode, by displaying a couple of display panels at the same time, the image 34 obtained by the electronic optical system can be observed on the monitor display panel 32, and the image 35 obtained by the optical microscope can be observed on the monitor display panel 33 at the same time. In addition, the status when measuring the position relation can be monitored at the same time. In FIG. 3, the components 36 and 37 are icons.

In the scanning electron microscope having the above described optical microscope, in order to evaluate the position relation of the wafer set on the X-Y stage beforehand before measuring a designated pattern formed on the wafer, the position relation with respect to the coordinates of the X-Y stage is measured on the basis of a typical wafer pattern by using the optical microscope. Next, now that the position relation is evaluated explicitly, the coordinate system of the wafer with respect to the optical microscope is transformed so as to be equivalent to the coordinate system of the X-Y stage.

As the relative distance between the electronic optical system and the optical microscope is calibrated strictly by using the fiducial pattern based on the present invention, the coordinate system of the wafer with respect to the optical axis of the electronic optical system is similarly transformed accurately. Therefore, in the observation and measurement of a designated pattern formed on the wafer by using the electronic optical system so calibrated as described above, the positioning of the pattern can be enabled in a short time even with high magnification.

Further, the present invention discloses the following construction as another embodiment.

Among the fiducial patterns, a plurality of patterns are provided in the side being detected by the charged particle beam and have different dimensions.

The dimensions of the plurality of patterns are determined based on the measuring magnifications by the charged particle beam. With such a construction, positioning can be performed after the charged particle mean apparatus is set to a desired magnification. When a magnification is changed after positioning, there is possibility to change the irradiation position of the beam. Therefore, it is preferable that positioning is performed after changing the magnification. The aforementioned construction is for this purpose.

In the present invention, it is necessary that the patterns detected by the optical microscope are positioned corresponding to the different pattern positions. That is, a plurality of patterns for the optical microscope are respectively formed on positions in the same distance from the patterns observed or detected by the charged particle beam. It is also possible to form only a single pattern for the optical microscope depending on positioning of patterns for the charged particle beam apparatus. This can be attained by forming the patterns for the charged particle beam apparatus in gathering to a single place. In detail, one idea is that a smaller mark is successively arranged on a larger mark. When the center of the larger mark agrees with the center of the smaller mark, it is sufficient to form only a single pattern for the optical microscope.

As for another embodiment, even in an ion beam apparatus for the observation, analysis and work of the fine patterns by using ion beams, in case of using an optical microscope in addition to the ion beam optical system, the present invention similarly enables the precise calibration and positioning of the distance between the optical axis of the ion beam optical system and the optical axis of the optical microscope.

As for another embodiment different from above described embodiments, a scanning electron microscope and an electron-beam exposure apparatus having 2 or more electronic optical systems exist. Those are apparatuses for the observation, or measurement and work of the specimen by 2 or more electronic optical systems.

Figure 4:
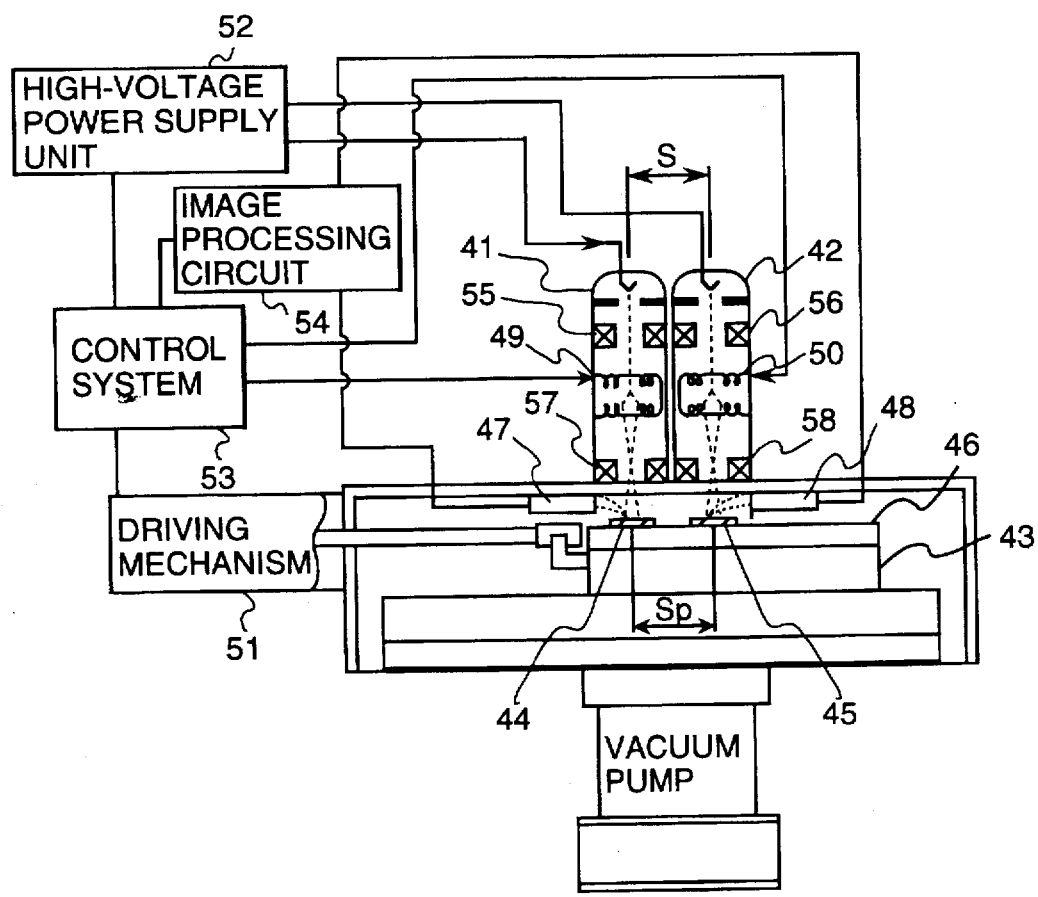
FIG. 4 is a view showing the construction of an electron beam drawing apparatus as an embodiment of a charged particle beam apparatus in accordance with the present invention.

In FIG. 4, one embodiment of the electron-beam exposure apparatus having two electronic optical systems is shown. In this apparatus, it is required to keep the position relation between a couple of electronic optical systems 41 and 42 in higher precision. In order to keep precisely the distance S between the electronic optical systems 41 and 42, two fiducial patterns 44 and 45 based on the present invention which has a distance Sp equivalent to the distance between electronic optical systems are formed. By using the fiducial pattern, the mutual distance between two electronic optical systems can be maintained in high precision. In the scanning electron microscope having two electronic optical systems, in case of observing and measuring the patterns, the detection of identical patterns can be performed in high precision and high speed.

In FIG. 4, the component 46 is a specimen holder, the components 47 and 48 are secondary electron detectors, the components 49 and 50 are bias coils, the components 55 to 58 are electron lenses, the component 52 is a high voltage power unit used for the electron gun, the component 51 is an X-Y stage drive mechanism, the component 53 is a control system, and the component 54 is an image processing circuit, where like parts shown in FIG. 1 have substantially the same functions.

As seen from the above description, in the scanning electron microscope having an optical microscope, the position relation between the optical microscope and the electron microscope can be maintained in high precision, and the pattern observed and measured by the optical microscope can be positioned to its corresponding visible scopes with high magnification for the electronic optical system in high precision and high speed. As a result, in observing a designated pattern and measuring its size, though much time has been spent for exploring an optimal pattern by shifting up the magnifications in many steps in a conventional method, the present invention enables to make the optimal positioning search time for a single pattern at most 10 seconds in contrast to the conventional search time from 15 to 20 seconds, and therefore, the positioning operation can be performed very quickly. The similar effect can be also brought to the electron-beam exposure apparatus and the ion beam apparatus, each having an optical microscope.

On the other hand, the relative position between a couple of patterns, each formed at the same time by using an electron beam exposure apparatus having two electronic optical systems, can be determined in high precision. The similar effect can be also brought to the ion beam exposure apparatus.

What is claimed is:

1. A charged particle beam apparatus having a charged particle beam optical system comprising:
   a generator generating a charged particle beam;
   a deflector deflecting the charged particle beam;
   a stage on which a specimen is mounted:
   a microscope optical system for irradiating light onto said specimens;
   first and a second fiducial patterns, associated respectively with said charged particle beam and said optical system, provided on any one of said specimen and said stage on which said specimen is mounted,
   means for detecting said first and second fiducial patterns separately by using the charged particle beam optical system and the optical system, respectively so as to measure positions of said first and second fiducial patterns, and means for calibrating a distance between an optical axis of said charged particle beam optical system and said optical system is calibrated on the basis of said measured positions.

2. The charged particle beam apparatus according to claims 1, wherein said first and said second fiducial patterns are so laid out that a distance between said fiducial patterns is equivalent to a distance between an optical axis of said optical microscope and an optical axis of said charged particle beam optical system.

3. The charged beam apparatus according to claim 1, wherein said first and said second fiducial patterns are formed on an identical member mounted on said stage.

4. The charged particle beam apparatus according to any one of claim 1 to claim 3, wherein observation and position measurement of said first and second fiducial patterns are performed at a same time.

5. The charged particle beam apparatus according to claim 4, further comprising means for shifting a position of a center of an optical axis of said charged particle beam optical system with an offset on a basis of a center of an optical axis of said optical microscope.

6. The charged particle beam apparatus according to claim 4, further comprising means for shifting a position of a center of an optical axis of said optical microscope with an offset on a basis of a center of an optical axis of said charged particle beam optical system.

7. The charged particle beam apparatus according to claim 1, which further comprising;
   a display part having a first and a second display panel;
   an image of said first fiducial pattern obtained by using said optical system displayed on said first display panel; and
   an image of said second fiducial pattern obtained by using said charged particle beam optical system displayed on said second display panel;
   whereby each pattern is displayed at a same time.

8. The charged particle beam apparatus according to claim 1, wherein one of said first and said second fiducial pattern comprises:
   a plurality of different sized patterns, and the other of said first and said second fiducial pattern are respectively spaced from said plurality of different sized patterns.

9. The charged particle beam apparatus according to claim 8, wherein said plurality of different sized patterns are formed so as to have dimensions matching with measuring magnifications of said charged particle beam apparatus.

10. A charged particle beam apparatus comprising a first and a second charged particle beam optical system including a charged particle source for generating a charged particle beam and means for directing said charged particle beam to a specimen mounted on a stage, a first and a second fiducial pattern formed on said stage, means for observing said first and said second fiducial patterns independently by using said first and second charged particle beam optical systems whereby positions of said patterns are measured and means for calibrating a distance between the an optical axis of said first and said second charged particle beam system on the basis of said measured positions.

11. A method of operating a charged particle beam apparatus having a charged particle beam optical system including;
   a generator generating a charged particle beam;
   a deflector deflecting the charged particle beam;
   a stage on which a specimen is mounted;
   a microscope optical system for irradiating light onto said specimen; and
   first and a second fiducial patterns, associated respectively with said charged particle beam and said optical system, provided on any one of said specimen and said stage, comprising:
   detecting said First and second fiducial patterns separately by using the charged particle beam optical system and the optical system, respectively;
   measuring positions of said first and second fiducial patterns; and calibrating a distance between an optical axis of said charged particle beam optical system and said microscope optical system on the basis of said measured positions.

12. The method according to claims 11, wherein said first and said second fiducial patterns are so laid out that a distance between said fiducial patterns is equivalent to a distance between an optical axis of said optical system and an optical axis of said charged particle beam optical system.

13. The method according to claim 11 wherein said first and said second fiducial patterns are formed on an identical member mounted on said stage.

14. The method according to claim 11 comprising performing observation and position measurement of said first and second fiducial patterns at a same time.

15. The method according to claim 13, comprising adjusting a position of a center of an optical axis of said charged particle beam optical system by shifting said position with an offset on a basis of a center of an optical axis of said optical microscope.

16. The method according to claim 13, comprising adjusting a position of a center of an optical axis of said optical microscope by shifting said position with an offset on a basis of a center of an optical axis of said charged particle beam optical system.

17. The method according to claim 11, wherein said apparatus further includes a display part having first and second display panels, and further including:

displaying an image of said first fiducial pattern by using said optical system displayed on said first display panel; and at the same time, displaying an image of said second fiducial pattern obtained by using said charged particle beam optical system on said second display panel.

18. A method of operating a charged particle beam apparatus having a stage on which a specimen is mounted and first and second charged particle beam optical systems each including a generator generating a charged particle beam and a deflector deflecting the charged particle beam onto said specimen, first and a second fiducial patterns being formed on said stage, comprising:

measuring the positions of said first and second fiducial patterns separately by using said first and second charged particle beam optical systems; and calibrating a distance between the optical axes of said first and second charged particle beam optical systems on the basis of said measured positions.

* * * * *

UNITED STATES PATENT AND TRADEMARK OFFICE
CERTIFICATE OF CORRECTION

PATENT NO. : 5,747,816
DATED : 5 May 1998
INVENTOR(S) : Toshiei KUROSAKI

It is certified that error appears in the above-identified patent and that said Letters Patent is hereby corrected as shown below:

| Column | Line | |
|---|---|---|
| 1 | 13 | After "For example," delete "there is". |
| 2 | 18 | Change "try-and error" to --trial-and-error--. |
| 3 | 7 | After "Features" insert --of the present invention--. |
| 7 | 47 | After "mounted" change ":" to --;--. |
| 7 | 49 | Change "specimens" to --specimen--. |
| 7 | 60 | After "system" (second occurrence) delete "is calibrated". |
| 8 | 52 | After "including" change ";" to --:--. |
| 8 | 63 | Change "said First" to --said first--. |

Signed and Sealed this

Eighth Day of December, 1998

Attest:

*Attesting Officer*

BRUCE LEHMAN

*Commissioner of Patents and Trademarks*